(12) United States Patent
Tamura et al.

(10) Patent No.: US 11,312,188 B2
(45) Date of Patent: Apr. 26, 2022

(54) TIRE DETERIORATION STATE PREDICTION METHOD

(71) Applicant: BRIDGESTONE CORPORATION, Tokyo (JP)

(72) Inventors: Daisuke Tamura, Tokyo (JP); Keiichi Sakai, Tokyo (JP); Shinichiro Yamazaki, Tokyo (JP); Seita Komori, Tokyo (JP)

(73) Assignee: BRIDGESTONE CORPORATION, Tokyo (JP)

( * ) Notice: Subject to any disclaimer, the term of this patent is extended or adjusted under 35 U.S.C. 154(b) by 361 days.

(21) Appl. No.: 16/308,130

(22) PCT Filed: May 23, 2017

(86) PCT No.: PCT/JP2017/019250
§ 371 (c)(1),
(2) Date: Dec. 7, 2018

(87) PCT Pub. No.: WO2017/212915
PCT Pub. Date: Dec. 14, 2017

(65) Prior Publication Data
US 2019/0160886 A1 May 30, 2019

(30) Foreign Application Priority Data
Jun. 9, 2016 (JP) .............................. JP2016-115480

(51) Int. Cl.
*B60C 11/24* (2006.01)
*B60C 99/00* (2006.01)
(Continued)

(52) U.S. Cl.
CPC .......... *B60C 11/246* (2013.01); *B60C 99/006* (2013.01); *G01M 17/02* (2013.01); *G06F 30/00* (2020.01)

(58) Field of Classification Search
CPC combination set(s) only.
See application file for complete search history.

(56) References Cited

U.S. PATENT DOCUMENTS

2004/0230412 A1* 11/2004 Morman, Jr. ............. B60C 9/20
703/8
2008/0059134 A1* 3/2008 Miyashita ............. G01M 17/02
703/8
(Continued)

FOREIGN PATENT DOCUMENTS

| CN | 103674573 A | 3/2014 |
|---|---|---|
| CN | 104778313 A | 7/2015 |

(Continued)

OTHER PUBLICATIONS

Kevin R. J. Ellwood, et al., "Numerical Simulation of Thermal Oxidation In Automotive Tires", Rubber Chemistry and Technology, 2006, pp. 249-266, vol. 79.
(Continued)

*Primary Examiner* — Jennifer Bahls
(74) *Attorney, Agent, or Firm* — Sughrue Mion, PLLC

(57) ABSTRACT

A tire deterioration state prediction method for predicting, by a computer, the deterioration state of a tire using a tire model configured from multiple elements comprises an information acquisition step for acquiring information relating to a use environment, which includes the pressure history and the temperature history in an air chamber during tire use, and the history of load acting on the tire, and information relating to the tire characteristics, including the material characteristics of members configuring the tire; a temperature history calculation step for calculating, for each element, the temperature history of the tire on the basis of the information acquired in the information acquisition step; an oxygen concentration history calculation step for calculating, for each element, the oxygen concentration history on (Continued)

the basis of the information and the temperature history of each element; and a tire deterioration state evaluation step for evaluating the deterioration state of the tire on the basis of the oxygen concentration history of each element.

8 Claims, 6 Drawing Sheets

(51) Int. Cl.
  *G01M 17/02* (2006.01)
  *G06F 30/00* (2020.01)

(56) References Cited

U.S. PATENT DOCUMENTS

| | | | |
|---|---|---|---|
| 2010/0010795 A1* | 1/2010 | Fevrier | G06F 30/15 703/8 |
| 2010/0030533 A1* | 2/2010 | Ueda | G01M 17/02 703/2 |
| 2014/0067193 A1* | 3/2014 | Gokyu | B60C 99/006 701/31.9 |
| 2014/0366618 A1* | 12/2014 | Singh | B60C 11/24 73/146.3 |
| 2017/0246915 A1* | 8/2017 | Besnoin | B60C 23/0488 |

FOREIGN PATENT DOCUMENTS

| | | |
|---|---|---|
| EP | 2703194 A1 | 3/2014 |
| JP | 05-152234 A | 6/1993 |
| JP | 2005-138621 A | 6/2005 |
| JP | 2005-306174 A | 11/2005 |
| JP | 2007-210528 A | 8/2007 |
| JP | 2008-298723 A | 12/2008 |
| JP | 2010-167847 A | 8/2010 |
| JP | 2011-156972 A | 8/2011 |
| JP | 2012-013640 A | 1/2012 |

OTHER PUBLICATIONS

International Search Report for PCT/JP2017/019250 dated Aug. 1, 2017 [PCT/ISA/210].
Communication dated Mar. 14, 2019 from the European Patent Office in application No. 17810096.2.
International Preliminary Report on Patentability with the translation of Written Opinion dated Dec. 20, 2018 issued by the International Bureau in No. PCT/JP2017/019250.
Search Report dated Dec. 12, 2019 issued by the State Intellectual Property Office of P.R. China in counterpart application No. 2017800358066.

\* cited by examiner

TIRE CROSS SECTIONAL VIEW

CROSS-SECTIONAL MODEL

TIRE MODEL

TIRE DETERIORATION STATE PREDICTION METHOD

CROSS REFERENCE TO RELATED APPLICATIONS

This application is a National Stage of International Application No. PCT/JP2017/019250 filed May 23, 2017, claiming priority based on Japanese Patent Application No. 2016-115480 filed Jun. 9, 2016.

TECHNICAL FIELD

The present invention relates to a tire deterioration state prediction method, and more particularly to a method for predicting a deterioration state of an in-use or used tire.

BACKGROUND

As a tire reclamation method, retreading has been conventionally performed by removing the worn tread rubber and re-sticking new tread rubber. In the retreading, a portion other than the tread rubber, a so-called casing is reused. Therefore, a deterioration state is predicted in order to judge whether the casing itself has a lifetime capable of withstanding the reclamation.

For example, PTL 1 predicts a tire deterioration state by giving conditions such as an input load to a tire, a used atmosphere temperature, etc. assuming tire deformation and tire use environments and numerically analyzing a tire temperature distribution state. And, NPL 1 predicts a deterioration state of a rubber member due to oxidation by presuming a tire use state and numerically analyzing an oxygen concentration in the rubber member at a tire temperature of 60-70° C.

CITATION LIST

Patent Literature

PTL 1: Japanese Unexamined Patent Application Publication No. 2010-167847

Non-Patent Literature

NPL 1: By Kevin R. J. Ellwood, John Baldwin, David R. Bauer, "Numerical Simulation of Thermal Oxidation in Automotive Tires", Rubber Chemistry and Technology, Vol. 79 No. 2 2006

SUMMARY OF THE INVENTION

Technical Problem

But, the NPL 1 predicts the tire deterioration state on the basis of the temperature only, and there is still room for improvement in prediction accuracy. The prediction in the NPL 1 shows that tire deterioration is strongly influenced by oxidation during heating, but while the tire is being actually used, the temperature change at each part of the tire with time is not taken into consideration, and there is still room for improvement in prediction accuracy.

The present invention is provided in view of the above problems and aims to provide a tire deterioration state prediction method capable of improving prediction accuracy for a deterioration state of an in-use or used tire.

Solution to Problem

One aspect of the present invention relates to an embodiment of a tire deterioration state prediction method in order to solve the above problem. This is a tire deterioration state prediction method for predicting, by a computer, the deterioration state of a tire by using a tire model configured from multiple elements, comprising an information acquisition step for acquiring information relating to a use environment, which includes the pressure history and the temperature history in an air chamber during tire use and the history of a load acting on the tire, and information relating to the tire characteristics, including the material characteristics of members configuring the tire; a temperature history calculation step for calculating, for each element, the temperature history of the tire on the basis of each information acquired in the information acquisition step; an oxygen concentration history calculation step for calculating, for each element, the oxygen concentration history on the basis of each information and the temperature history of each element; and a tire deterioration state evaluation step for evaluating the deterioration state of the tire on the basis of the oxygen concentration history of each element.

In this embodiment, the deterioration state is determined not by an actual measurement but by calculation, so that survivability performance of a tire in use or a used tire can be grasped in real time, and the service life of the tire or an allowable time before retreading can be grasped accurately. Since the prediction is performed for each element indicating a tire inside, a deterioration state immeasurable within tire rubber can also be grasped. Thus, it is clear what part of the tire is deteriorating, so that the remaining lifetime of the tire can be grasped accurately, and the tire being used can be prevented from suffering from a failure.

Although the present invention will be explained in detail with reference to embodiments of the invention, but it should be understood that the following embodiments do not limit the invention according to the spirit and scope of the appended claims and that all of combinations of characteristics explained in the embodiments are not necessarily essential for solving means of the invention but also include constructions to be adopted selectively.

DESCRIPTION OF EMBODIMENTS

Exemplary Embodiment

Figure 1:
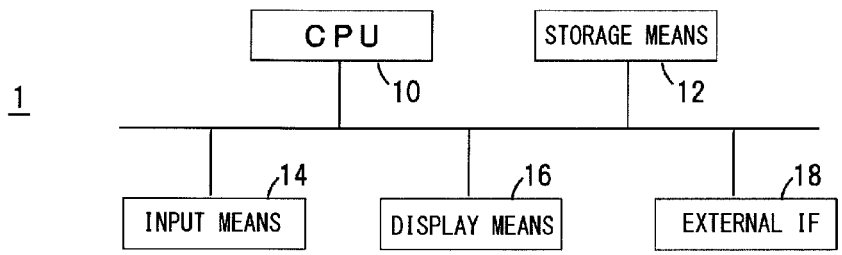
FIG. 1 is a configuration view of a tire deterioration state prediction device.

FIG. 1 is a configuration view of a tire deterioration state prediction device 1. The tire deterioration state prediction device 1 is composed of a so-called computer and provided with a CPU 10 as a computing means which is provided as a hardware resource, a storage means 12 including ROM, RAM, etc., an input means 14 such as a keyboard, a mouse, a magnetic or optical drive, a display means 16 such as a monitor, an external connection interface (external IF) 18 for connecting a network interface, an external device, etc. The CPU 10 executes later-described processing according to a program stored in the storage means 12 to make the tire deterioration state prediction device 1 function as later-described respective means.

The tire deterioration state prediction device 1 predicts a deterioration state of a tire casing by simulating on the basis of a use environment of a tire in use or a used tire. This embodiment is described to predict a period from a new tire mounted time to the present time (when it is necessary to grasp a tire deterioration state).

Figure 2A:
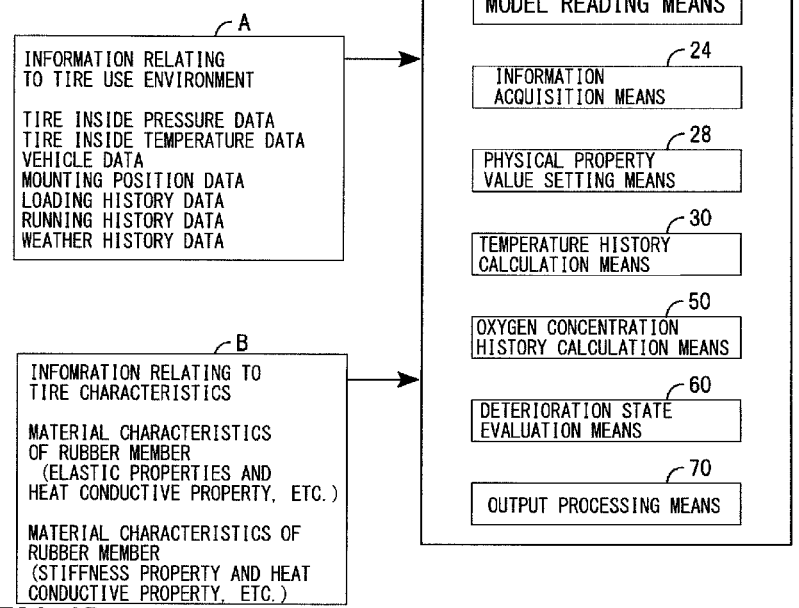
FIGS. 2A, 2B and 2C are block diagrams of the tire deterioration state prediction device.
Figure 2B:
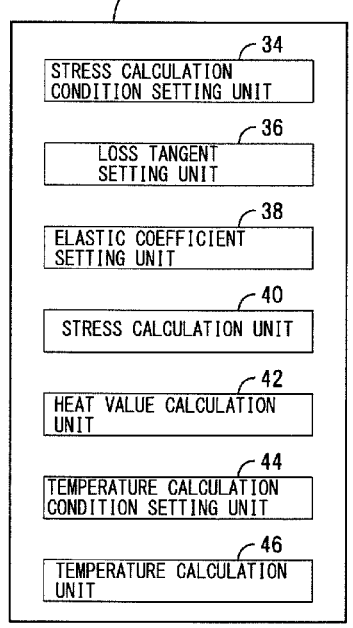
Figure 2C:
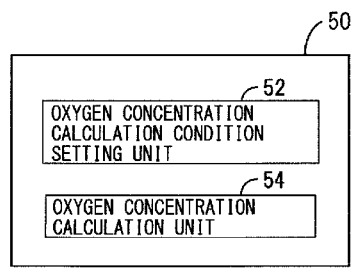

FIGS. 2A, 2B and 2C are block diagrams of the tire deterioration state prediction device 1. As shown in FIG. 2A, the tire deterioration state prediction device 1 uses a tire model M configured from multiple elements to be numerically analyzable to predict a deterioration state of a tire in use. The tire deterioration state prediction device 1 is provided with a model reading means 20 for reading the tire model M, an information acquisition means 24 for reading information A relating to a use environment of tire R and information B relating to tire characteristics, a physical property value setting means 28 for setting a physical property value of a member constituting an actual tire R to the tire model M, a temperature history calculation means 30 for calculating a temperature history of the tire R in the use period on the basis of the information A and B acquired by the information acquisition means 24, an oxygen concentration history calculation means 50 for calculating an oxygen concentration history in the use period of the tire R on the basis of the information A and B acquired by the information acquisition means 24 and the temperature history calculated by the temperature history calculation means 30, a deterioration state evaluation means 60 for evaluating a tire deterioration state on the basis of the oxygen concentration history calculated by the oxygen concentration history calculation means 50, and an output processing means 70 for executing output processing of the evaluation result.

The model reading means 20 executes reading of a simulation model for simulating a deterioration state of a subject tire R by a computer. For example, the simulation model is composed of the tire model M obtained by modeling the subject tire R, a rim model Mr with the tire R assembled on a rim, an air chamber model Mc obtained by modeling a space surrounded by the rim and the tire R assembled on the rim, a road surface model N obtained by modeling a road surface, etc. It is also possible to omit the rim model Mr and the air chamber model Mc, and a necessary boundary condition is set for an element (node) which defines the air chamber of a tire inner peripheral surface and the element (node) which contacts the rim model Mr of a tire outer peripheral surface.

Figure 3A:
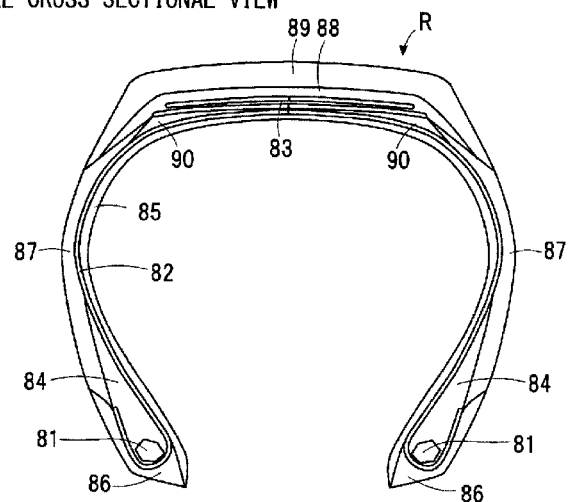
FIGS. 3A, 3B and 3C are tire sectional views and a view showing a tire model.

FIG. 3A is a sectional view showing a structure of the tire R to be predicted. As shown in the same figure, the tire R has a belt 83, which is formed of at least one belt ply, provided on the outer peripheral side of the crown region of a carcass 82 which is formed of at least one carcass ply toroidally extended between a pair of bead stiffeners formed of a bead core 81 and a bead filler 84. A belt under rubber 90 is provided between the carcass 82 and an end side of the belt 83. A base rubber 88 and a tread rubber 89 are provided in this order on the radially outside of the belt 83 of the tire. A rim cushion rubber 86, which contacts the rim from a bead part side, and a side rubber 87 are provided on the outer side of the side region of the carcass 82. An inner liner 85 for enhancing airtightness in the air chamber is provided on the inside whole area of the carcass 82.

Figure 3B:
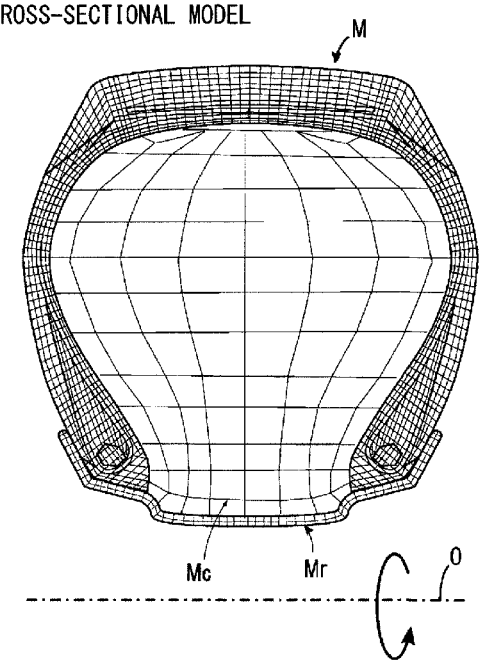
Figure 3C:
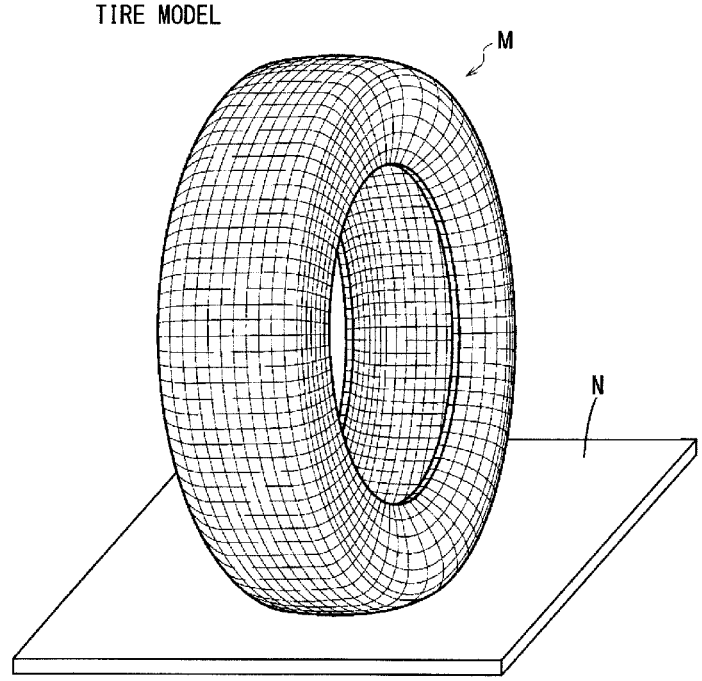

FIGS. 3B and 3C are figures showing examples of the tire model M corresponding to the tire R. The tire model M shown in FIG. 3B is a cross-sectional model formed according to the sectional view of the tire R shown in FIG. 3A. In this embodiment, the tire model M is configured from a two-dimensional cross-sectional model and a three-dimensional solid model. The cross-sectional model is formed of multiple separated elements for each member configuring the tire R on the basis of CAD data when designing the tire corresponding to the sectional view shown in FIG. 3A. For example, this cross-sectional model has respective members of the bead filler 84 composed of a rubber member only, the inner liner 85, the side rubber 87, the base rubber 88, the tread rubber 89, the belt under rubber 90 and the bead core 81 composed of a cord member only divided by plane elements.

The carcass 82 and the belt 83 which are composed as a fiber composite material of the cord member and the rubber member are modeled as follows. First, for the carcass 82, carcass cords in one carcass ply are modeled by line elements, and a rubber member (topping rubber) covering the carcass cords is modeled by a plane element.

And, the carcass cords modeled as the line elements are sandwiched from the upper and lower sides by the topping rubber which is modeled as the plane elements to provide a model as one carcass ply.

For the belt 83, the belt cord is similarly modeled by line elements in the same manner as the carcass ply, and the rubber member (topping rubber) covering the belt cord is modeled by plane elements. And, the belt cord modeled as the line element is sandwiched from the upper and lower sides by the topping rubber modeled as the plane elements to model one belt ply. Thus, the tire model M is formed as the two-dimensional cross-sectional model. For example, the tire model M as the two-dimensional cross-sectional model has a shape that the tire R is assembled on a rim to have a non-load state when a prescribed internal pressure is applied.

The tire model M as the three-dimensional solid model shown in FIG. 3C is obtained by turning and spreading the cross-sectional model shown in FIG. 3B in the tire circumferential direction at an equal pitch angle for one round (360 degrees) with around a rotary center axis O of the tire R. Thus, the plane elements in the cross-sectional model shown in FIG. 3B become a solid element (three-dimensional element), and line elements are composed as membrane (plane) elements (two-dimensional elements). For the membrane elements corresponding to the carcass 82 and the belt 83 of the fiber composite material of the cord member and the rubber member, for example anisotropy due to a difference between stiffness of the cord in an arrangement direction and stiffness of the cord in a direction orthogonal to the arrangement direction is set as a physical property value.

The rim model Mr and the air chamber model Mc are respectively configured corresponding to the two-dimensional cross-sectional model and the three-dimensional solid model of the tire model M. That is, the rim model Mr is composed by the cross-sectional model which is configured of the multiple plane elements so as to correspond to the solid model and a two-dimensional tire model M which are configured from the multiple solid elements so as to correspond to the three-dimensional tire model M.

And the air chamber model Mc is configured of the cross-sectional model which is configured of the multiple plane elements to correspond to the solid model and the two-dimensional tire model M which is configured from the multiple solid elements so as to correspond to the three-dimensional tire model M.

The road surface model N is modeled for example by a plate element of a flat rigid body. And an actual rough road surface may be modeled by solid elements. The creation of the road surface model N may be omitted, and a boundary condition may be given to the tire model M in later processing.

The information acquisition means 24 reads the information A relating to the tire use environment and the information B relating to the tire characteristics. The information A relating to the tire use environment is information for grasping a history of the tire use state during the use period of the tire R and for example configured to include tire inside pressure data in a tire air chamber in the use period, tire inside temperature data, vehicle data, mounting position data, loading history data, running history data, weather history data, etc.

The tire inside pressure data and the tire inside temperature data are obtainable by TPMS for example. The TPMS measures the pressure and temperature of air in the air chamber by the sensors provided in the tire air chamber and transmits by radio to the main body unit provided on a vehicle body. A storage medium in the main body unit records the received pressure and temperature as sell as time and notifies a state of the tire R by displaying to the driver. Measurement by the TPMS is started when the tire R is assembled on a rim and use of the tire R mounted on a vehicle is started. In other words, the storage medium records the pressure and time of the tire R being used from a new state of the tire R to the present time as a history.

Vehicle data is comprised of including information on various specifications such as a vehicle weight, a number of axles, an axle load, an axle length, and an exhaust port position (exhaust position) of the tire R mounted vehicle. The mounting position data is data specifying the mounting position of the tire R and composed to include, for example, information specifying the position of the tire R mounted axle, the right and left positions of the axle, and the inner and outer positions of a double tire.

The loading history data is composed to include information on a time-series change (loading history) of a loading weight of luggage during the use period of the tire R. For example, the loading history can be made into data according to a log or the like by an operations manager, or made into data according to the tire inside pressure data during the tire use measured by the TPMS. When data is made according to the tire inside pressure data, it may be configured so that, for example, a pressure with no luggage is loaded is determined as a reference pressure, the presence or not of loading is judged on the basis of a transitional pressure change when the luggage is loaded or unloaded, and the loading weight is calculated on the basis of a difference between the pressure value and the reference pressure when it is judged that there is luggage.

The running history data is composed to include information such as a history of running route from a new state to the present state and a history of a running speed. The running history data can be obtained, in case of commercially used vehicles such as track, buses, and taxis, from an operation recorder or the like that is mandatory to mount on the vehicle.

The weather history data is composed to include information such as weather, temperature, etc. The weather history data can be obtained from a private company that provides, for example, the weather data and weather information available from the Meteorological Agency.

The information B relating to the tire characteristics is constituted to include physical property values of material physical properties (elastic properties and heat conductive property) of respective rubber members and material physical properties (stiffness property and heat conductive property) of the cord member constituting the tire R of which deterioration state is to be predicted. The physical property values include material characteristics such as density $\rho$, elastic coefficient (longitudinal elastic coefficient, transverse elastic coefficient), loss tangent tan $\delta$, and elastic modulus of bead core, and specific heat c, thermal conductivity k, diffusion coefficient D, etc.

In addition, the information B relating to the tire characteristics is constituted to include a thermal conductivity of the rim on which the tire R is assembled, a thermal conductivity of gas to be injected into the air chamber, such as air, nitrogen or the like, a heat transfer coefficient at a boundary between the rim and the gas in the air chamber, a heat transfer coefficient at a boundary between the gas in the air chamber and the tire R, and physical property values such as the rim, gas density $\rho$, specific heat c, etc.

The information A relating to the tire use environment and the information B relating to the tire characteristics are stored into the storage means 12 via the input means 14 and the external IF 18.

The physical property value setting means 28 sets, on the basis of the information B relating to the tire characteristics and according to a kind of tire component member corresponding to each element constituting the tire model M, material characteristics such as density $\rho$, elastic coefficient (longitudinal elastic coefficient, transverse elastic coefficient), loss tangent tan $\delta$, elastic modulus and stiffness of the bead core, and physical property values such as specific heat c, thermal conductivity k, diffusion coefficient D to respective elements.

The physical property values to be set to the respective elements are set by a constant value or a function. For example, a constant value denoting a characteristic of the member corresponding to each element is set for the density $\rho$, specific heat c, thermal conductivity k, etc. The density $\rho$ of the rubber member is determined not depend on a temperature and not change assuming a non-compression ultra-elastic body having Poisson's ratio of about 0.5. And the elastic coefficients such as the longitudinal elastic coefficient and the transverse elastic coefficient, the loss tangent tan $\delta$, and the diffusion coefficient D of the rubber member are set as a function of temperature T to each element. The elastic coefficient, loss tangent tan $\delta$, and diffusion coefficient D are described later.

And, the physical property value setting means 28 sets the thermal conductivity, density $\rho$ and specific heat c corresponding to each element constituting the rim model Mr and the air chamber model Mc.

The temperature history calculation means 30 calculates a temperature history of the tire R from new to the present time on the basis of the information A relating to the above tire use environment and the information B relating to the tire characteristics. As shown in FIG. 2B, the temperature history calculation means 30 is provided with a stress calculation condition setting unit 34, a loss tangent setting unit 36, an elastic coefficient setting unit 38, a stress calculation unit 40, a heat value calculation unit 42, a temperature calculation condition setting unit 44, and a temperature calculation unit 46. The temperature history calculation means 30 calculates a temperature history using the solid model shown in FIG. 3C in the tire model M.

The stress calculation condition setting unit 34 sets conditions, which are required for calculation of stress $\sigma$ and strain $\varepsilon$ during use of the tire R by the later-described stress calculation unit 40, to the tire model M. For example, the stress calculation condition setting unit 34 specifies the mounting position of the tire R on the vehicle according to the mounting position data, obtains the axle load at the relevant position according to the vehicle data, also obtains the mounted load at the relevant position according to the loading history data, and sets a load combining the axle load and the mounted load as the load acting on the tire R to the tire model M. Since the load acts on the tire R via the rim, it is set to a node corresponding to the position in contact with the rim (rim model Mr) in the tire model M.

For example, a rigid body condition having no change (no change condition) in mutual positional relation is set to the rim contacted node. The condition to be set to the node to which the rim is contacted is not limited to the above rigid body condition (no deformation condition), and for example a constraint condition or the like is also set to restrain only the contact to the rim so that the state of contact to the rim is kept but a change in the positional relation between the nodes is allowed.

And, the pressure in the air chamber when the tire is used is set on the basis of the tire inside pressure data to elements (elements defining the air chamber of the tire R) constituting the air chamber model Mc.

The loss tangent setting unit 36 sets the value of loss tangent tan $\delta$ that is set as a function to each element of the tire model M by the physical property value setting means 28. The loss tangent tan $\delta$ is set as a function of temperature T, so that it is necessary to substitute by a numerical value. Accordingly, the loss tangent setting unit 36 calculates the numerical value of the loss tangent tan $\delta$ by giving the temperature T to the loss tangent tan $\delta$, which is set as a function to each element.

Figure 4:
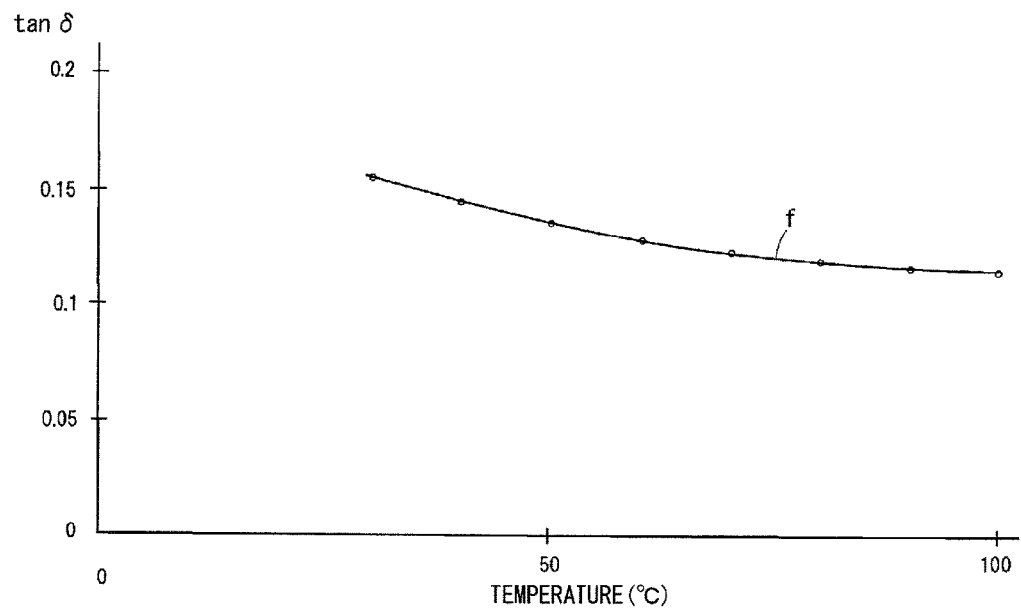
FIG. 4 is a graph showing a relation between tan δ and temperature T.

FIG. 4 is a graph showing the relation between the loss tangent tan $\delta$ and the temperature T. This graph was made by preparing a vulcanized test specimen of rubber members constituting the tire R by measuring the tan $\delta$ at each temperature while the temperature for heating the test specimen is varied according to JIS K6394 and ISO 4664. In the figure, f is a function showing the relation between the loss tangent tan $\delta$ and the temperature T, and for example it is calculated using least square approximation.

The function showing the relation between the loss tangent tan $\delta$ and the temperature T is generated for each rubber member and stored in the storage means 12. And, the loss tangent setting unit 36 reads the function according to the rubber member corresponding to each element from the storage means 12 and sets as a physical property value to each element.

The elastic coefficient setting unit 38 calculates a value of an elastic coefficient set as a function to each element of the tire model M. The elastic coefficient must be replaced by a numerical value similar to the loss tangent tan $\delta$, because it is set as a function to each element as the function of the temperature T. Therefore, similar to the loss tangent tan $\delta$, the relation between the elastic coefficient and the temperature T is predetermined for each rubber member by an experiment, and a numerical value of the elastic coefficient is calculated every time the temperature T is set and updated for each element.

The stress calculation unit 40 sets a state that the tire model M in the state assembled on the rim is in contact with the road surface model N, and calculates stress $\sigma$ and strain $\varepsilon$ acting on the tire R running. Specifically, the stress calculation unit 40 calculates the stress $\sigma$ and strain $\varepsilon$ of each element by performing stress analysis of each element on the basis of the conditions such as pressure and load in the tire set by the stress calculation condition setting unit 34, and physical property values showing the material characteristics such as the density $\rho$, loss tangent tan $\delta$, elastic coefficient, and stiffness of the bead core set for each element by the physical property value setting means 28.

The heat value calculation unit 42 calculates heating value Q involved in deformation during use of the tire. The tire R is deformed when grounded and rolled on the road surface and a strain is caused on each member. It is considered that the strain causes a strain energy loss by rolling of the tire R and mostly emitted as heat. Therefore, the heating value Q can be calculated by an equation (shown on the right side of [Formula. 1]) for calculating strain energy.

$$Q = V \times \alpha \times \sigma \times \varepsilon \times \tan \delta \quad \text{[Formula. 1]}$$

where, V denotes a volume of each element, $\sigma$ denotes a stress of each element, $\varepsilon$ denotes a strain of each element, and tan $\delta$ denotes a loss tangent of each element. The volume V of each element adopts the tire model M having a shape with no load.

For the tire model M, the temperature calculation condition setting unit 44 sets a temperature initial condition and a temperature condition for calculating a temperature of the tire R by the temperature calculation unit 46. The temperature initial condition is set for all elements. For example, the temperature T when the TPMS starts measuring is set for all elements. A new tire R which is assembled on the rim and to which an inner pressure is applied can be considered that a temperature and an air temperature T in the air chamber are the same as the outside air temperature. Therefore, the temperature T measured by the TPMS is regarded same as a measured outside air temperature, and the same temperature T is set as the initial temperature to all elements of the tire model M, the air chamber model Mc and the rim model Mr.

The temperature condition is set to each node corresponding to the tire outer peripheral surface. And, a heat transfer condition according to the speed is set to the node of the tire outer peripheral surface, and an air temperature recorded as an atmosphere temperature in the weather history data is set.

The elements on the tire outer peripheral surface are elements constituting the surfaces of the rim cushion rubber 86, the side rubber 87 and the tread rubber 89. When the mounting position data corresponds to the exhaust port position in the vehicle data, the exhaust temperature is set on the tire outer peripheral surface instead of the temperature T recorded in the weather history data.

And, the heat transfer coefficient of air from the tire into the air chamber and the heat transfer coefficient of air from the air chamber into the tire are set on each node corresponding to the tire inner peripheral surface (the boundary between the air chamber model Mc and the tire model M).

The temperature calculation unit 46 calculates the temperature at the use time of the tire R for each element of the tire model M, the air chamber model Mc and the rim model Mr. That is, the temperature calculation unit 46 collectively calculates the temperatures of the respective elements constituting the tire model M, the air chamber model Mc and the rim model Mr.

In this embodiment, when the temperature T is calculated by the temperature calculation unit 46, the heating value Q involved in deformation of the tire R is taken into consideration, and the temperature of each part of the tire R is calculated on the basis of the conditions determined by the above temperature calculation condition setting unit 44.

The temperature calculation unit 46 determines an equation (unsteady heat transfer equation) shown in [Formula. 2] as a basic equation, converts this [Formula. 2] to a finite element equation (discretization equation) by a finite element method, and performs time integration of the temporal differentiation term on the left side to calculate the temperature of each element after prescribed time Δt. That is, calculation start time t0 of the temperature T by the temperature calculation unit 46 is determined as a time when the tire is brand new, and calculation is repeated so to progress at every time interval Δt for the period until the present time(tend), to calculate the temperature history of the tire R, in detail the time history of the temperature T of each element of the tire model M.

$$\rho c \frac{\partial T}{\partial t} = \frac{\partial}{\partial x_i}\left(k \frac{\partial T}{\partial x_i}\right) + Q \quad (i = 1, 2, 3) \quad \text{[Formula 2]}$$

where, ρ denotes a density, c denotes specific heat, k denotes thermal conductivity, and Q denotes a heating value.

The heating value Q is set to zero when a temperature of each element constituting the air chamber model Mc and the rim model Mr is calculated.

The temperature calculation unit 46 calculates the temperature T of the tire R at each time by [Formula. 2] considering the heat generation due to deformation when the tire is used, but as described above, the elastic coefficient and loss tangent tan δ of each rubber member for calculating the heating value Q are functions of the temperature T. That is, the heating value Q is also a function of the temperature T. Therefore, the temperature T of the tire R is calculated in this embodiment by continuously performing an arithmetic operation of the temperature T of each element by [Formula. 2] of the temperature calculation unit 46, an arithmetic operation of the heating value Q to be input to [Formula. 2], and a calculation of a stress of the tire R for obtaining the stress σ and strain ε to be input to [Formula. 1] for calculating the heating value Q. A specific calculation process of the temperature T will be described later.

As shown in FIG. 2C, the oxygen concentration history calculation means 50 has an oxygen concentration calculation condition setting unit 52 and an oxygen concentration calculation unit 54. The oxygen concentration calculation condition setting unit 52 sets an oxygen concentration initial condition and an oxygen concentration boundary condition for calculation of the oxygen concentration by the oxygen concentration calculation unit 54 on the tire model M. The oxygen concentration history calculation means 50 calculates a temperature history using the cross-sectional model in the tire model M. The oxygen concentration initial condition is set to all elements. For example, oxygen concentration 0 (zero) is set.

The oxygen concentration boundary condition is set to the node corresponding to the tire inner peripheral surface and the elements constituting the outer peripheral surface. For example, an oxygen concentration C corresponding to the air volume in the air chamber is set on the element of the tire inner peripheral surface. And, every time when the oxygen concentration C is calculated by the oxygen concentration calculation unit 54 described later, an oxygen concentration ΔC portion, which is moved from the element constituting the tire inner peripheral surface to the element provided inward (carcass side) by one, is set as a decrease of the oxygen concentration C in the air chamber. In other words, it is set on the element corresponding to the tire inner peripheral surface so as to decrease the oxygen concentration ΔC for the moved portion from the oxygen concentration C in the air chamber at a previous time. And, the oxygen concentration C contained in the atmosphere is set on the elements corresponding to the tire outer peripheral surface.

The oxygen concentration calculation unit 54 calculates the oxygen concentration C at each element of the tire R on the basis of the temperature history data calculated by the temperature history calculation means 30 and the oxygen concentration initial condition and the oxygen concentration boundary condition which are set by the oxygen concentration calculation condition setting unit 52. The oxygen concentration calculation unit 54 has the equation (unsteady diffusion equation) shown in [Formula. 3] as a basic equation, converts [Formula. 3] to a finite element equation (discretization equation) on the basis of a finite element method, and performs time integration of the temporal differentiation term on the left side to calculate a time history of the oxygen concentration C in each element of the tire model M.

$$\frac{\partial C}{\partial t} = \frac{\partial}{\partial x_i}\left(D(T)\frac{\partial C}{\partial x_i}\right) - \omega(T) \quad \text{[Formula 3]}$$

where, C denotes an oxygen concentration, D(T) denotes a diffusion coefficient, and ω(T) denotes an oxygen consumption amount. The ω(T) is a reaction term due to oxidation of the rubber member. As shown in the equation, the diffusion coefficient D(T) and the oxygen consumption amount ω(T) are functions of a place and temperature T.

The diffusion coefficient D(T) of each element is calculated by [Formula. 4], and the oxygen consumption amount ω(T) is calculated by [Formula. 5]. As shown in [Formula. 4] and [Formula. 5], the diffusion coefficient D(T) and the oxygen consumption amount ω(T) are functions of the temperature T, so that the temperature T of a time corresponding to the time integration by the oxygen concentration calculation unit 54 is obtained from the temperature history data.

$$D(T) = D_0 \exp\left(-\frac{E_{0D}}{kT}\right) \quad \text{[Formula 4]}$$

$$\omega(T) = \omega_0 \exp\left(-\frac{E_{0\omega}}{kT}\right) \quad \text{[Formula 5]}$$

where, D0 denotes a diffusion coefficient as reference, E0D denotes activation energy, ω0 denotes an oxygen consumption amount as reference, E0ω denotes activation energies, and κ denotes a Boltzmann constant. These numerical values are set as physical property values on each member corresponding to each element and set as physical property values on each element.

Figure 5:
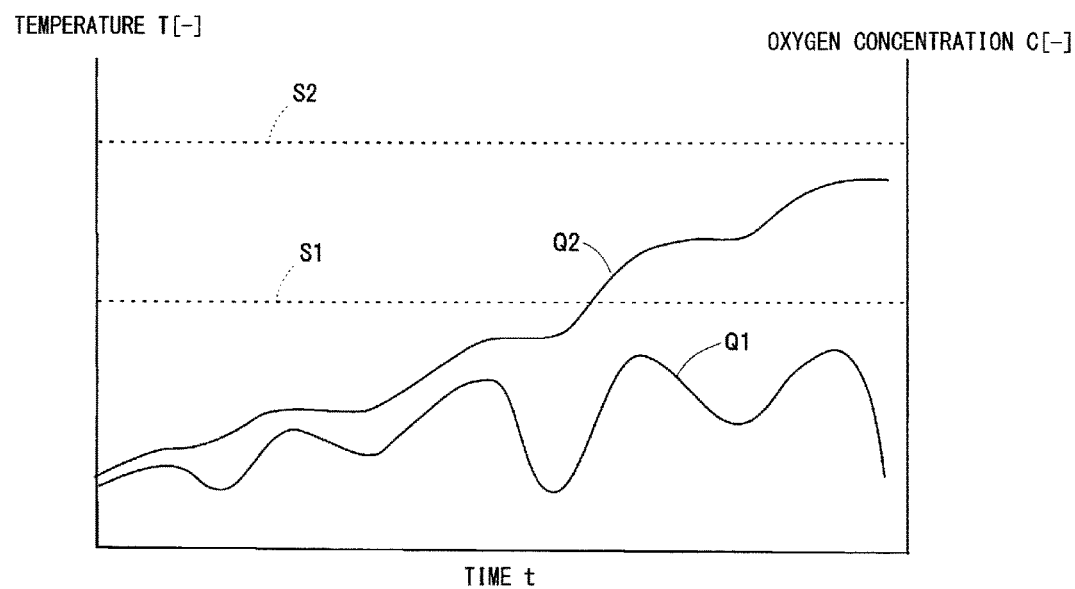
FIG. 5 is a graph showing the calculated temperature history line and oxygen concentration history line.

FIG. 5 shows a calculated temperature history line and an oxygen concentration history line. In the figure, Q1 is a temperature history line showing temperature history data and Q2 is an oxygen concentration history line showing oxygen concentration history data. And, S1 is a threshold line showing a threshold of an oxygen concentration to be retreadable, and S2 is a limit value line showing a limit value of the oxygen concentration which shows a final lifetime of the tire casing.

The deterioration state evaluation means 60 evaluates a deterioration state of the tire casing on the basis of the oxygen concentration history line. In other words, the deterioration state evaluation means 60 evaluates the deterioration state on the basis of a state of the oxygen concentration in the tire casing assuming that the deterioration was caused by oxidation. The deterioration state evaluation means 60 compares the value of a final oxygen concentration C, which was calculated on each element by the oxygen concentration history calculation means 50, with threshold S1 and limit value S2 to predict the propriety of retreading at the present point of time, a time until the threshold S1 and a time until the limit value S2.

As shown in FIG. 5, the temperature T changes up and down with a lapse of time as indicated by the temperature history line Q1. Meanwhile, the oxygen concentration C continues to increase with a lapse of time as indicated by the oxygen concentration history line Q2 because oxygen is consumed and accumulated as the rubber member and the cord member are oxidized. That is, the oxygen concentration C at each time can be assumed to be an accumulated amount from the time when the product is brand new. Then, the deterioration state evaluation means 60 compares the oxygen concentration C of each element at the final time (present time) END with the threshold S1 and the limit value S2 corresponding to each element so as to judge the propriety of retreading and usability as a tire. And, the remaining lifetime of the tire R can be evaluated, and the deterioration state of the tire R can be judged.

The output processing means 70 processes to display the calculation result by each means. For example, the output processing means 70 shows the temperature history line Q1 and the oxygen concentration history line Q2, which are shown in FIG. 5, on the display means 16 and also executes display output processing of the determined result for the possibility of retreading and the possibility of use as a tire, the time until threshold S1 is reached, the time until the limit value S2 is reached, etc.

Figure 6:
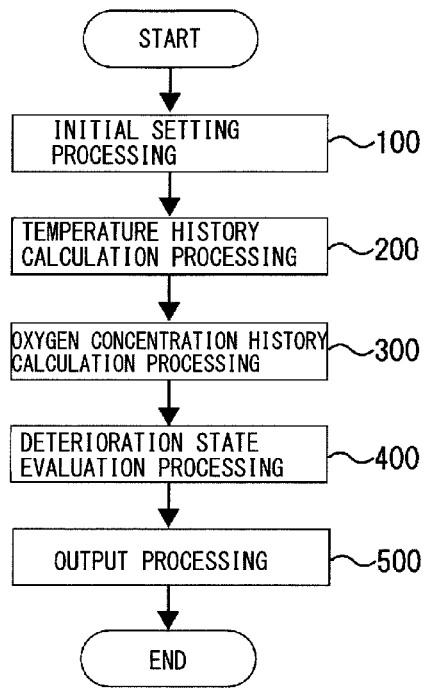
FIG. 6 is a flow chart showing an outline of processing of a tire deterioration state prediction device 1.

FIG. 6 is a flow chart showing outline processing of the tire deterioration state prediction device 1 configured as described above. FIG. 7 to FIG. 10 are flow charts showing details of each processing in FIG. 6. Processing by the tire deterioration state prediction device 1 is explained below with reference to the respective figures. As shown in FIG. 6, the tire deterioration state prediction device 1 performs initial setting processing 100, temperature history calculation processing 200, oxygen concentration history calculation processing 300, deterioration state evaluation processing 400, and output processing 500.

The tire deterioration state prediction device 1 predicts a deterioration state of a subject tire according to the information A relating to the use environment of the tire R of which deterioration state is predicted, the information B relating to tire characteristics, a tire model M, an air chamber model Mc, a rim model Mr and a road surface model N which are input via the input means 14 and the external IF 18 by an operator operation.

In the following description, an arbitrary time in time t is denoted as time tm, a temperature at the time tm is denoted as T(m), and an oxygen concentration is denoted as C(m). Here, m is an integer such as 0, 1, 2, 3, . . . tm . . . , END, denoting a time, and m=0, namely t0 denotes a time when a tire is brand new, and END denotes the present point of time.

[Initial Setting Processing S100]

Figure 7:
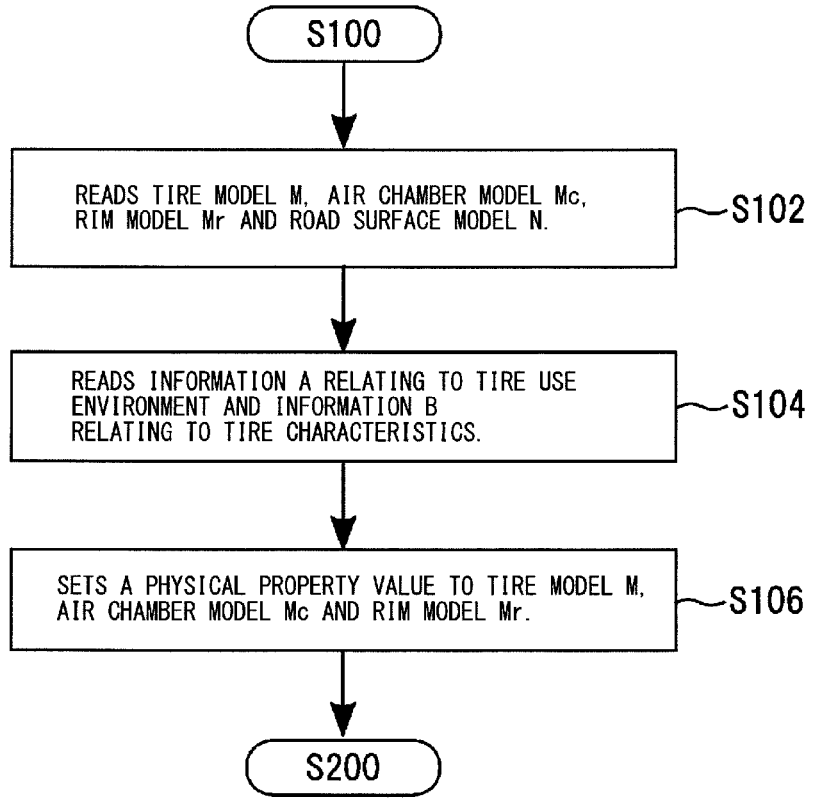
FIG. 7 is a flow chart showing detailed processing of an initial setting processing S100.

FIG. 7 is a flow chart showing detailed processing of initial setting processing S100.

(S102)

The model reading means 20 reads the tire model M, the air chamber model Mc, the rim model Mr and the road surface model N stored in the storage means 12.

(S104)

The information acquisition means 24 reads the information A relating to the tire use environment stored in the storage means 12 and the information B relating to the tire characteristics.

(S106)

The physical property value setting means 28 sets a physical property value corresponding to each element of the tire model M, the air chamber model Mc and the rim model Mr.

[Temperature History Calculation Processing S200]

Figure 8:
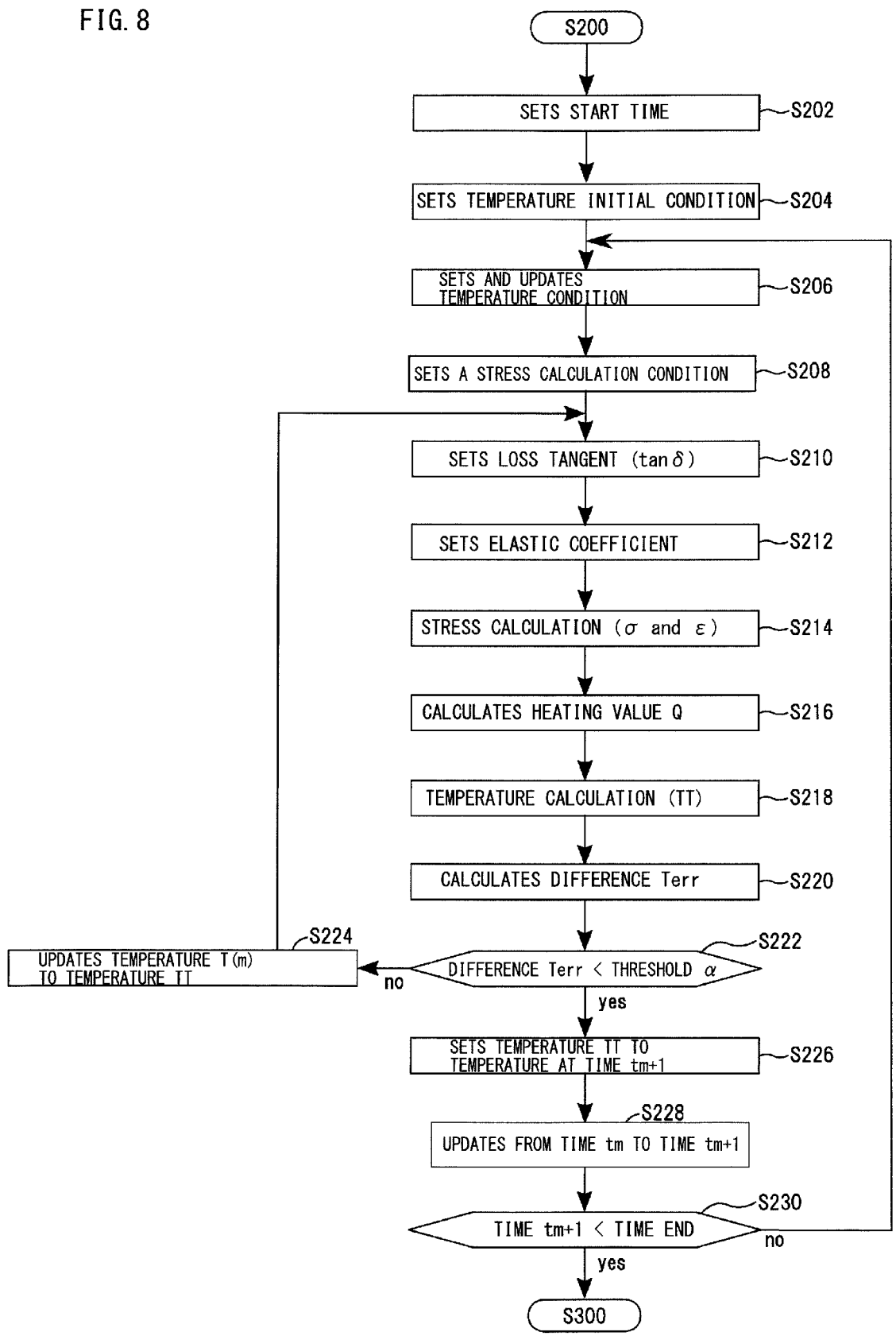
FIG. 8 is a flow chart showing detailed processing of temperature history calculation processing S200.

FIG. 8 is a flow chart showing detailed processing of temperature history calculation processing S200.

(S202)

A start time of calculating a temperature history is set. In this embodiment, time t0 is set as a use start time in order to calculate the temperature history from the start of using the tire R in a brand-new state to the present point of time.

(S204)

The temperature calculation condition setting unit 44 sets a temperature initial condition for the tire model M, the air chamber model Mc and the rim model Mr. Specifically, temperature T(0) at time t0 is read from the tire inside temperature data, and this temperature T(0) is set on all elements of the tire model M, the air chamber model Mc and the rim model Mr.

(S206)

A temperature condition is set to the tire model M, the air chamber model Mc and the rim model Mr. Specifically, temperature T(m) corresponding to time tm is read from the tire inside temperature data to set to elements constituting the outer peripheral surface of the tire model M.

(S208)

The stress calculation condition setting unit 34 sets a stress calculation condition. Specifically, a load at the corresponding time tm is set on the basis of the mounting position data, vehicle data and loading history data in the information A relating to the tire use environment, and a pressure at the time tm is set to the element corresponding to the air chamber model Mc from the tire inside pressure data.

(S210)

A value of tan δ, which is set to each element on the basis of temperature T(tm) set to each element, is calculated and set to each element.

(S212)

A value of the elastic coefficient, which is set to each element on the basis of the temperature T(tm) set to each element, is calculated and set to each element.

(S214)

Stress σ and strain of the tire R at the time tm are calculated on the basis of the load and pressure set in S208 and the elastic coefficient set in S212.

(S216)

The stress σ and strain calculated in S214 are applied to [Formula. 1] to calculate heating value Q.

(S218)

The heating value Q calculated in S216 is applied to [Formula. 2] to calculate temperature T(m+1) at time tm+1. The temperature calculated in this step is temporarily set as temperature TT. This is processing to calculate the temperature T(m+1) at the time tm+1 by solving continuously the stress calculation of the tire R in S214 and the heating value calculation in S216 because the heating value Q applied in this step is a function of the temperature. Thus, the temperature T(m+1) at next time tm+1 can be calculated accurately by determining by continuously solving the temperature T(m+1) at the next time tm+1.

(S220)

Difference Terr between the temperature TT calculated in S218 and the temperature T(m) at a preceding time tm is calculated.

(S222)

The difference Terr calculated in S220 is compared with threshold α. When the difference Terr is larger than the threshold α, it is determined that the temperature TT is not the temperature T(m+1) at the time tm+1, and the procedure goes to S224. When the difference Terr is smaller than the threshold α, the temperature TT may be assumed as the temperature T(m+1) at the time tm+1, and the procedure goes to S226. The threshold α is a criterion to judge whether the temperature TT may be assumed as the temperature T(m+1) at the next time tm+1.

(S224)

The temperature TT calculated in S218 is updated as a value of the temperature T (m) which was set to each element when the temperature TT was calculated, and the procedure goes to S210. In other words, the temperature T(t) of each element at the time when the temperature TT was calculated is substituted to the temperature TT, and stress calculation, heating value calculation, and temperature calculation are executed again.

(S226)

When the difference Terr is lower than the threshold α by the judgment in S222, the temperature TT is set as temperature T(tm+1) at a time advanced from the time tm by time Δt.

(S228)

The time tm is updated to time tm+1.

(S230)

It is judged whether the time updated in S228 is the time END at the present point of time. When the judged time tm+1 is smaller than the time END, the procedure goes to S300, and when the time tm+1 reaches the time END, the procedure goes to S206. In other words, S206 to S228 are repeated again to calculate a temperature history from the time 0 to the time END at each part of the tire R.

[Oxygen Concentration History Calculation Processing S300]

Figure 9:
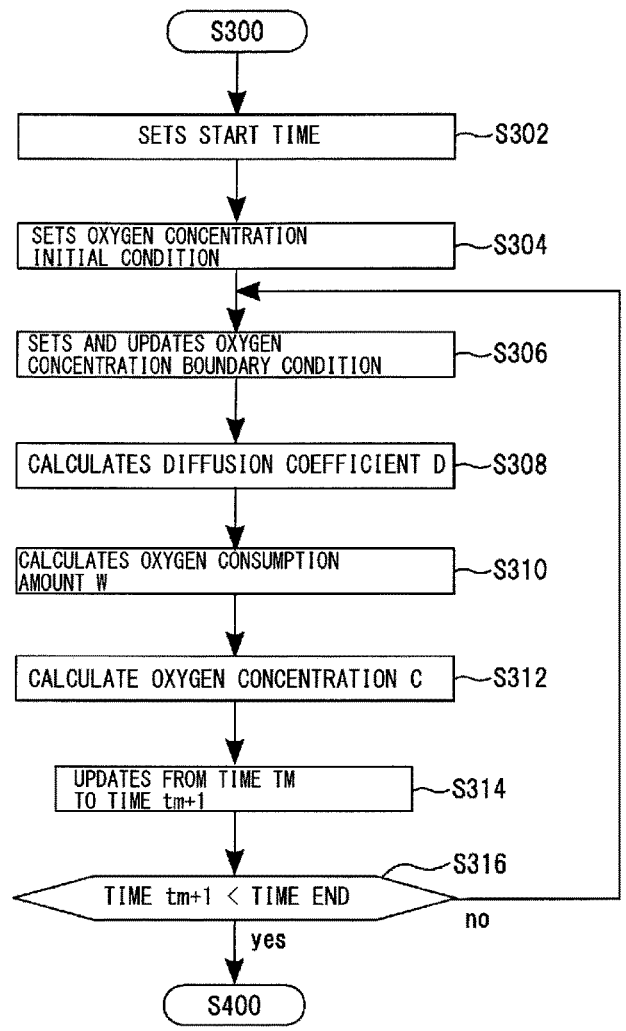
FIG. 9 is a flow chart showing detailed processing of oxygen concentration history calculation S300.

FIG. 9 is a flow chart showing detailed processing of oxygen concentration history calculation S300.

(S302)

The start time to calculate the oxygen concentration history is set. In this embodiment, time t0 is set as a use start time to calculate an oxygen concentration history from the start of using the tire R in a brand-new state to the present point of time.

(S304)

The oxygen concentration initial condition is set on the tire model M by the oxygen concentration calculation condition setting unit 52. Specifically, oxygen concentration C(0) is set to zero for all elements constituting the tire model M.

(S306)

The oxygen concentration boundary condition is set to the tire model M. For the elements constituting the tire inner peripheral surface, the oxygen concentration C corresponding to the air volume sealed in the air chamber at the time t0 is determined as a start value, and the oxygen concentration is set to reduce the oxygen concentration ΔC for the portion moved from the oxygen concentration C in the air chamber at a previous time in each progress of the time. And the oxygen concentration contained in the atmosphere is set to the elements of the tire outer peripheral surface.

(S308)

The temperature T(m) at the corresponding time tm is obtained from the temperature history data calculated in S200, and the diffusion coefficient D, which is set on each element by using the temperature T(m), is calculated by [Formula. 4] to set the diffusion coefficient D of each element as a numerical value.

(S310)

The temperature T(m) at the corresponding time tm is obtained from the temperature history data calculated in S200, and oxygen consumption amount W, which is set to each element by using the temperature T(m), is calculated by [Formula. 5] to set the oxygen consumption amount W of each element as a numerical value.

(S312)

The numerical values of the diffusion coefficient D and the oxygen consumption amount W set in S308 and S310 are used to calculate oxygen concentration C(m+1).

(S314)

The time tm is updated to time tm+1.

(S316)

It is judged whether the time updated in S314 is the time END of the present point of time. When it is judged that the time tm+1 is smaller than the time END, the procedure goes to S306, and when the time tm+1 is the time END, the procedure goes to S400.

[Deterioration State Evaluation Processing S400]

Figure 10:
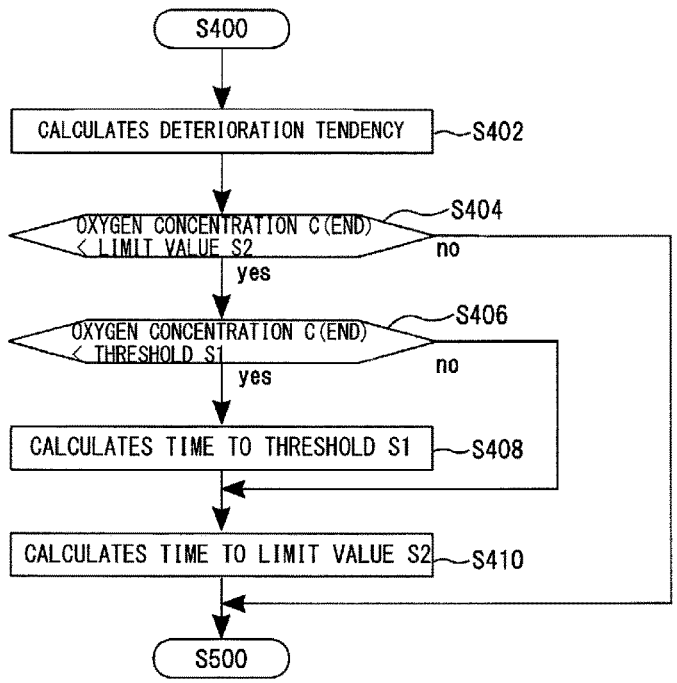
FIG. 10 is a flow chart showing detailed processing of deterioration state evaluation processing S400.

FIG. 10 is a flow chart showing detailed processing by deterioration state evaluation processing S400. The processing is performed on each element.

(S402)

A deterioration tendency showing an increase ratio of oxygen concentration with time is calculated on the basis of the oxygen concentration history data calculated in S300.

(S404)

Oxygen concentration C(END) is compared with the limit value S2, and when it is smaller than the limit value S2, the procedure goes to S406, and when it is larger than the limit value S2, the procedure goes to S500. Thus, when it is smaller than the limit value S2, it is judged that use as a tire is possible, and when it is not smaller than the limit value S2, it is judged that use as a tire is not possible.

(S406)

The oxygen concentration C(END) is compared with threshold S1, and when it is smaller than the threshold S1, the procedure goes to S408, and when it is not smaller than the threshold S1, the procedure goes to S410. Thus, when it is smaller than the threshold S1, it is judged that retreading is possible, and when it is not smaller than the threshold S1, it is judged that retreading is impossible.

(S408)

A difference between the threshold S1 and the oxygen concentration C(END) is calculated, a time to reach the threshold S1 is calculated on the basis of the deterioration tendency calculated in S402, and the procedure goes to S410. Thus, time to a limit of retreading is predicted.

(S410)

A difference between the limit value S2 and the oxygen concentration C(END) is calculated, a time to reach the limit value S2 is calculated on the basis of the deterioration tendency calculated in S402, and the procedure goes to S500. Thus, a time to a lifetime limit as a tire is predicted.

[Display Output Processing]

(S500)

Judgment and prediction result obtained in S402 to S410 are displayed on the display means 16.

It was described in the above embodiment that the oxygen concentration history is calculated on the basis of the temperature history from the new state to the present point of time, but the start time and the end time of the history can be set properly. In other words, even when the tire is in use, the information A relating to the environment in the middle of tire use and the information B relating to tire characteristics are input, and a tire deterioration tendency can be grasped.

As described above, since the deterioration state is predicted by simulating in this embodiment, survivability performance of a tire in use or a used tire can be grasped in real time according to the prediction. That is, a lifetime as the tire, an allowed time until retreading and the like can be predicted. Since every element showing the tire inside is predicted, a deterioration state of rubber of the immeasurable tire inside can be grasped. Thus, it is clear which part of the tire is deteriorated progressively, so that the remaining lifetime of the tire can be grasped accurately, and the tire being used can be prevented from a failure or the like.

The embodiment was explained above, and it can be summarized as follows. That is, this is a tire deterioration state prediction method for predicting, by a computer, the deterioration state of a tire by using a tire model configured from multiple elements, comprising an information acquisition step for acquiring information relating to a use environment, which includes the pressure history and the temperature history in an air chamber during tire use and the history of a load acting on the tire, and information relating to the tire characteristics, including the material characteristics of members configuring the tire; a temperature history calculation step for calculating, for each element, the temperature history of the tire on the basis of each information acquired in the information acquisition step; an oxygen concentration history calculation step for calculating, for each element, the oxygen concentration history on the basis of each information and the temperature history of each element; and a tire deterioration state evaluation step for evaluating the deterioration state of the tire on the basis of the oxygen concentration history of each element.

In this embodiment, the deterioration state is determined not by an actual measurement but by calculation, so that survivability performance of a tire in use or a used tire can be grasped in real time, and the service life of a tire or an allowable time before retreading can be grasped accurately. Since every element showing the tire inside is predicted, a deterioration state immeasurable in the tire rubber can be grasped. Thus, it is clear what part of the tire is deteriorating, so that the remaining lifetime of the tire can be grasped accurately, and the tire being used can be prevented from suffering from a failure.

In the temperature history calculation step, accuracy for prediction of tire deterioration can be further improved because a state of the tire being used can be reproduced by considering heat generation due to tire deformation calculated on the basis of the history of the load acting on the tire.

The multiple elements correspond to multiple members constituting the tire, so that a deterioration state at each part of the tire can be grasped.

The tire model is a solid model of the tire configured from multiple three-dimensional elements, and in the temperature history calculation step, a temperature history of the whole tire can be calculated accurately by calculating the temperature history of the tire for each element by using the solid model.

The tire model is a cross-sectional model which has a cut surface of the tire cut in the width direction configured from multiple elements, and the oxygen concentration history calculation step can accurately calculate an oxygen concentration history by calculating the oxygen concentration history of the tire for each element by using the cross-sectional model.

DESCRIPTION OF REFERENCE NUMERALS

1: Tire deterioration state prediction device
20: Model reading means
24: Information acquisition means
28: Physical property value setting means
30: Temperature history calculation means
50: Oxygen concentration history calculation means
60: Deterioration state evaluation means
70: Output processing means
M: Tire model
R: Tire

The invention claimed is:

1. A tire deterioration state prediction method for predicting, by a computer, the deterioration state of a tire used in a vehicle by using a tire model configured from multiple elements, comprising:
    acquiring information relating to a use environment from at least one sensor in the tire, the information relating to the use environment includes pressure history and temperature history in an air chamber of the tire during use of the tire and a history of a load acting on the tire during use of the tire, and information relating to tire characteristics, including material characteristics of members configuring the tire;
    calculating, for each element of the multiple elements of the tire model, a temperature history on the basis of each information relating to the use environment;
    calculating, for each element of the multiple elements of the tire model, an oxygen concentration history on the basis of each information relating to the use environment and the temperature history of each element; and
    evaluating a deterioration state of the tire by displaying a first time until a threshold oxygen concentration value indicating a time to retread the tire is reached and a second time until a limit oxygen concentration value indicating a final lifetime of a tread of the tire is reached on the basis of the oxygen concentration history of each element of the multiple elements of the tire model to determine whether to retread the tire; and
    initiating a retreading of the tire based on the deterioration state of the tire.

2. The tire deterioration state prediction method according to claim 1, wherein the temperature history calculation considers heat generation due to tire deformation calculated on the basis of the history of the load acting on the tire.

3. The tire deterioration state prediction method according to claim 1, wherein the multiple elements correspond to multiple members constituting the tire.

4. The tire deterioration state prediction method according to claim 1, wherein the tire model is a solid model of the tire configured from multiple three-dimensional elements, and in the temperature history calculation, the temperature history of the tire is calculated for each element by using the solid model.

5. The tire deterioration state prediction method according to claim 1, wherein the tire model is a cross-sectional model which has a cut surface of the tire cut in the width direction configured from multiple elements, and the oxygen concentration history calculation calculates an oxygen concentration history of the tire for each element by using the cross-sectional model.

6. The tire deterioration state prediction method according to claim 1, wherein the oxygen concentration history of each element of the multiple elements of the tire model is calculated by setting an oxygen concentration initial condition and an oxygen concentration boundary condition.

7. The tire deterioration state prediction method according to claim 6, wherein the oxygen concentration boundary condition comprises elements constituting a tire inner peripheral surface.

8. The tire deterioration state prediction method according to claim 7, wherein the oxygen concentration boundary condition further comprises elements constituting a tire outer peripheral surface.

* * * * *